(12) United States Patent
Ichinose et al.

(10) Patent No.: US 9,136,547 B2
(45) Date of Patent: Sep. 15, 2015

(54) FUEL CELL SYSTEM

(75) Inventors: Toshihiko Ichinose, Suwon-si (KR);
Dong-Rak Kim, Suwon-si (KR); Hyun Kim, Suwon-si (KR)

(73) Assignee: Samsung SDI Co., Ltd., Gyeonggi-Do (KR)

( * ) Notice: Subject to any disclaimer, the term of this patent is extended or adjusted under 35 U.S.C. 154(b) by 725 days.

(21) Appl. No.: 12/612,987

(22) Filed: Nov. 5, 2009

(65) Prior Publication Data
US 2010/0176876 A1 Jul. 15, 2010

(30) Foreign Application Priority Data
Jan. 13, 2009 (KR) .................. 10-2009-0002739

(51) Int. Cl.
*H01M 8/04* (2006.01)
*G01R 19/165* (2006.01)

(52) U.S. Cl.
CPC ...... *H01M 8/04552* (2013.01); *H01M 8/04671* (2013.01); *G01R 19/16538* (2013.01); *Y02E 60/50* (2013.01)

(58) Field of Classification Search
CPC .......... H01M 8/04552; H01M 8/04671; G01R 19/16538; Y02E 60/50
USPC .............. 429/430, 432; 365/226, 96
See application file for complete search history.

(56) References Cited

U.S. PATENT DOCUMENTS

| | | | | | |
|---|---|---|---|---|---|
| 3,268,364 | A | * | 8/1966 | Cade et al. | 429/432 |
| 3,437,905 | A | * | 4/1969 | Healey et al. | 363/80 |
| 5,324,996 | A | * | 6/1994 | Mote, Jr. | 326/21 |
| 5,444,663 | A | * | 8/1995 | Furuno et al. | 365/226 |
| 2002/0177018 | A1 | * | 11/2002 | Fuglevand | 429/22 |
| 2005/0008903 | A1 | * | 1/2005 | Bourilkov et al. | 429/9 |
| 2005/0215124 | A1 | | 9/2005 | Vale et al. | |
| 2006/0222916 | A1 | * | 10/2006 | Norimatsu et al. | 429/23 |
| 2007/0026266 | A1 | * | 2/2007 | Pelton et al. | 429/7 |
| 2007/0202371 | A1 | | 8/2007 | Takeda et al. | |
| 2008/0191702 | A1 | * | 8/2008 | Coenen | 324/434 |
| 2009/0181286 | A1 | * | 7/2009 | Brunner et al. | 429/50 |
| 2010/0188093 | A1 | | 7/2010 | Minoda et al. | |

FOREIGN PATENT DOCUMENTS

| | | | | |
|---|---|---|---|---|
| JP | 09-154251 A | 6/1997 | | |
| JP | 2000-092732 A | 3/2000 | | |
| JP | 2002-281681 A | 9/2002 | | |
| JP | 2003-070179 | 3/2003 | | |
| JP | 2003-243044 A | 8/2003 | | |
| JP | 2003-346850 A | 12/2003 | | |
| JP | 2004-265787 | * 9/2004 | ............. | H01M 8/04 |
| JP | 2004-265787 A | 9/2004 | | |
| JP | 2004265787 | * 9/2004 | ............. | H01M 8/04 |
| JP | 2005-250884 A | 9/2005 | | |
| JP | 2006-313493 | * 11/2006 | ............... | G05F 1/56 |
| JP | 2007-066643 A | 3/2007 | | |
| JP | 2007-522611 A | 8/2007 | | |
| JP | 2007-232417 A | 9/2007 | | |
| JP | 2010-170893 A | 8/2010 | | |
| KR | 2005-46631 | 5/2005 | | |

OTHER PUBLICATIONS

Japanese Office Action dated Jan. 31, 2012 for Japanese Patent Application No. JP 2009-096880 which shares priority of Korean Application No. KR 10-2009-0002739 with captioned U.S. Appl. No. 12/612,987.
T. Ichinose, et al., "Development of Voltage Monitoring Circuit for Fuel Cell", *49th Battery Symposium in Japan*, Nov. 5-7, 2008, Sakai, Japan, pp. 185.
Korean Notice of Allowance for Korean Patent Publication 10-2009-0002739—5 pages, dated Sep. 30, 2010.
Japanese Notice of Allowance dated Aug. 13, 2013 for Japanese Patent Application No. JP 2009-096880 which shares priority of Korean Patent Application No. KR 10-2009-0002739 with captioned U.S. Appl. No. 12/612,987.

* cited by examiner

*Primary Examiner* — Patrick Ryan
*Assistant Examiner* — Aaron Greso
(74) *Attorney, Agent, or Firm* — Knobbe Martens Olson & Bear LLP

(57) ABSTRACT

A fuel cell system, and a method of operating the fuel cell system to measure a performance difference of unit cells via an application-specific integrated circuit (ASIC) and to drive the ASIC with a low voltage from a separately included power source supply device.

10 Claims, 3 Drawing Sheets

FUEL CELL SYSTEM

CROSS-REFERENCE TO RELATED APPLICATIONS

This application claims the benefit of Korean Patent Application No. 2009-2739 filed in the Korean Intellectual Property Office on Jan. 13, 2009, the entire contents of which are incorporated herein by reference.

BACKGROUND OF THE INVENTION

1. Field of the Invention

Aspects of the present invention relate to a fuel cell system.

2. Description of the Related Art

A fuel cell system is a power system that directly converts energy of a chemical reaction of hydrogen in a hydrocarbon-based material, such as methanol, ethanol, and natural gas, with oxygen into electrical energy. As a clean energy source that can replace fossil energy, the fuel cell has an advantage of producing various ranges of outputs because of a stack structure formed by stacking unit cells, and such a fuel cell has been spotlighted as a small-sized and portable power source since energy density thereof is 4 to 10 times higher than that of a small lithium battery.

However, each unit cell has a different operation state due to deviations during a manufacturing process or uneven dispersion of location, pressure, and temperature of each unit cell in the fuel cell stack. Even though each unit cell has a similar operation state, performance of each unit cell deteriorates differently as the fuel cell system is continuously driven. Further, when performance of a given unit cell is severely decreased during use of the fuel cell stack, the power generation amount of the fuel cell stack is decreased while causing serial performance deterioration of adjacent unit cells so that a life-span of the fuel cell stack is reduced. Therefore, it is important to measure a performance difference between unit cells.

Meanwhile, in order to reduce the production cost of the fuel cell stack, the price of the fuel cell as well as the price of other devices should be decreased. For the cost reduction, a device to measure a performance difference of unit cells can be realized by an integrated circuit, such as an application-specific integrated circuit (ASIC). The ASIC generally requires 4-5V for operation. Conventionally, an operation voltage of the ASIC is supplied from a fuel cell stack; however, the ASIC may not be sufficiently driven by the voltage of the fuel cell stack. For example, a lithium ion battery has a unit cell voltage of about 3V, and when measuring a voltage of 10 unit cells, the voltage of the unit cells becomes greater than 30V so that the ASIC can be sufficiently driven. The configuration of driving the ASIC with the lithium ion battery is disclosed in Japanese Patent Laid-Open Publication No. 2003-70179. However, a voltage of a unit cell of the fuel cell is 0 to 0.8V so the ASIC cannot be sufficiently driven.

The above information disclosed in this Background section is only for enhancement of understanding of the background of the invention and therefore it may contain information that does not form the prior art that is already known in this country to a person of ordinary skill in the art.

SUMMARY OF THE INVENTION

Aspects of the present invention provide a fuel cell system having a reduced cost of operation by measuring a performance difference of unit cells via an application-specific integrated circuit (ASIC) and operating the ASIC with a low voltage from a separately included power source supply device.

A fuel cell system according to aspects of the present invention includes a fuel cell stack including a plurality of unit cells, an ASIC, and a constant voltage generator. According to aspects of the present invention, the ASIC is supplied with a power source voltage and a reference voltage from corresponding unit cells among the plurality of unit cells through connections established between the unit cells and the ASIC, measures a voltage of each unit cell, and discharges a unit cell when the measured voltage of the unit cell is higher than a predetermined reference value. According to aspects of the present invention, the constant voltage generator supplies a constant voltage to the ASIC that is higher than the power source voltage by a floating voltage. According to aspects of the present invention, a voltage difference between the constant voltage and the reference voltage is sufficient to operate at least the AISC. According to aspects of the present invention, the ASIC includes a power source voltage terminal to which the power source voltage is input, a constant voltage terminal to which the constant voltage is input, a first reference voltage terminal to which the reference voltage is input, and a plurality of cell voltage input terminals respectively connected to a plurality of anode terminals and a plurality of cathode terminals of the corresponding unit cells. According to aspects of the present invention, the power source voltage may be the highest voltage among voltages of the plurality of anode terminals of the unit cells, and the reference voltage is the lowest voltage among voltages of the plurality of cathode terminals of the unit cells.

According to aspects of the present invention, the constant voltage generator includes an input terminal to which a voltage to generate the floating voltage is supplied, an output terminal connected to the constant voltage terminal, and a second reference voltage terminal connected to the power source voltage terminal of the ASIC. According to aspects of the present invention, the constant voltage generator includes a transistor having a collector terminal connected to the input terminal and an emitter terminal connected to the output terminal, a Zener diode having a cathode terminal connected to a base terminal of the transistor and an anode terminal connected to the second reference voltage terminal, and a resistor connected between the collector terminal of the transistor and the cathode terminal of the Zener diode. According to aspects of the present invention, the floating voltage is a voltage obtained by subtracting a threshold voltage of the transistor from a breakdown voltage of the Zener diode. According to aspects of the present invention, the fuel cell system further includes a voltage supply unit to supply the voltage to the constant voltage generator to generate the floating voltage. According to aspects of the present invention, the fuel cell system further includes a plurality of resistors respectively connected between the anode terminal and the cathode terminal of each of the plurality of unit cells and the power source voltage terminal, the first reference voltage terminal, and the plurality of cell voltage input terminals. According to aspects of the present invention, the fuel cell system further includes a current blocking element between one of the resistors and the power source voltage terminal. According to aspects of the present invention, the current blocking element includes an operation amplifier having an input terminal connected to the resistor and an output terminal connected to the power source voltage terminal.

As described above, according to the aspects of the present invention, cost can be reduced by realizing a device for measuring a performance difference of unit cells as an ASIC and the ASIC can be normally driven with a low voltage by separately including a power source supply device for driving the ASIC.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
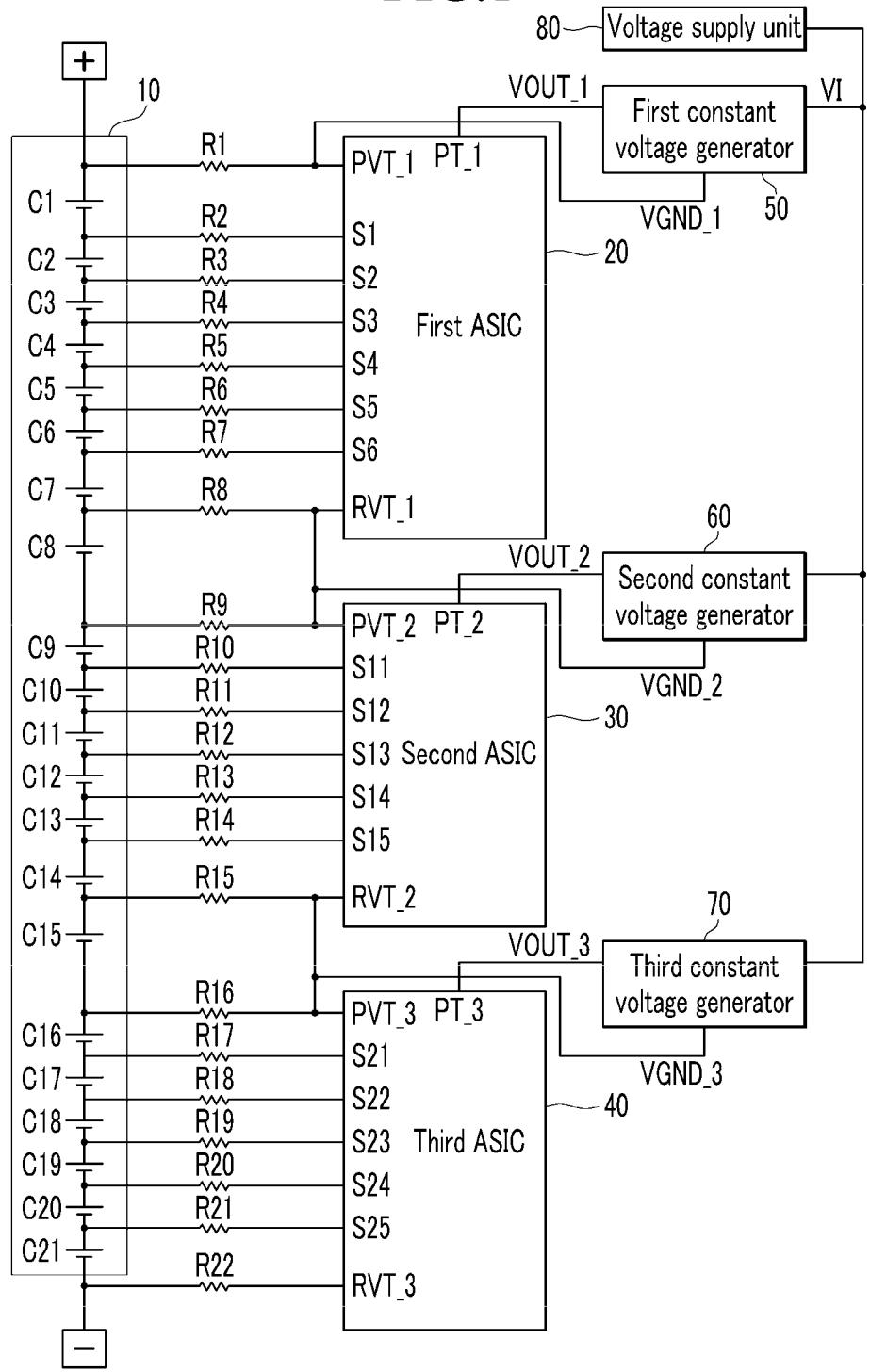
FIG. 1 shows a fuel cell system according to an exemplary embodiment of the present invention.

Reference will now be made in detail to exemplary embodiments according to aspects of the present invention, examples of which are illustrated in the accompanying drawings, wherein like reference numerals refer to the like elements throughout. The exemplary embodiments are described below in order to explain the present invention by referring to the figures.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations, such as "comprises" or "comprising," will be understood to imply the inclusion of stated elements but not the exclusion of any other elements.

Hereinafter, a fuel cell system according to an exemplary embodiment of the present invention will be described. FIG. 1 shows a fuel cell system according to an exemplary embodiment of the present invention. Referring to FIG. 1, the fuel cell system of the present exemplary embodiment includes a fuel cell stack 10, a plurality of resistors R1 to R22, first to third application-specific integrated circuits (ASICs) 20, 30, and 40, first to third constant voltage generators 50, 60, and 70, and a voltage supply unit 80.

The fuel cell stack 10 includes a plurality of unit cells C1 to C21 connected in series between a first voltage terminal (+) and a second voltage terminal (−). According to aspects of the present invention, the fuel cell stack 10 exemplarily includes 21 unit cells, of which groups of 7 unit cells are respectively connected to first to third ASICs 20, 30, and 40. However, aspects of the present invention are not limited thereto, and the fuel cell stack 10 may include a different number of unit cells and ASICs. The number of ASICs is determined according to the number of unit cells, the number of input pins, the number of output pins, and the processing speed of the ASIC. For example, the fuel cell stack 10 may include only one ASIC if such ASIC can appropriately control 21 unit cells.

An anode terminal and a cathode terminal of each of the plurality of unit cells C1 to C21 are connected to first sides of the corresponding protection resistors R1 to R22. Second sides of the plurality of protection resistors R1 to R8 are respectively connected to a first power voltage terminal PVT_1 of the first ASIC 20, cell voltage input terminals S1 to S6, and a first reference voltage terminal RVT_1. Second sides of the plurality of protection resistors R9 to R15 are respectively connected to a second power voltage terminal PVT_2 of the second ASIC 30, cell voltage input terminals S11 to S15, and a second reference voltage terminal RVT_2. Second sides of the plurality of protection resistors R16 to R22 are respectively connected to a third power voltage terminal PVT_3 of the third ASIC 40, cell voltage input terminals S21 to S25, and a third reference voltage terminal RVT_3. The plurality of protection resistors R1 to R22 protect transmission of surge voltages from the plurality of unit cells C1 to C21 to the first to third ASICs 20, 30, and 40.

The first ASIC 20 includes a first constant voltage terminal PT_1 to which a first constant voltage VOUT_1 is input, a first power source voltage terminal PVT_1 to which a first power source voltage is input, a first reference voltage terminal RVT_1 to which a first reference voltage is input, and the plurality of cell voltage input terminals S1 to S6 that are connected to nodes of the plurality of unit cells C1 to C7 through the plurality of resistors R2 to R7. The first constant voltage VOUT_1 is a voltage input from the first constant voltage generator 50, the first power source voltage is a voltage supplied from the anode terminal of the unit cell C1 through the resistor R1, and the first reference voltage is a voltage input from the cathode terminal of the unit cell C7 through the resistor R8. The first ASIC 20 measures a voltage difference between the first power source voltage terminal PVT_1 and the cell voltage input terminal S1 so as to measure a voltage of the unit cell C1. Further, the first ASIC 20 may measure a voltage difference between adjacent cell voltage input terminals to measure voltage of respective unit cells; for example, the first ASIC 20 may measure a voltage difference between the cell voltage input terminals S1 and S2 to determine a voltage of the unit cell C2. Or, the first ASIC 20 may measure a voltage difference between a cell voltage input terminal and the first power source voltage terminal PVT_1 to determine voltage of respective unit cells; for example, the first ASIC 20 may measure a voltage difference between the cell voltage input terminal S2 and the first power source voltage terminal PVT_1 to determine a voltage of the unit cell C2 if the voltage of the unit cell C1 is known. The first ASIC 20 may perform such measurements in a similar way so as to determine voltages for the unit cells C1 to C7.

It should be noted that the power source voltage maybe the highest voltage among voltages of the plurality of anode terminals, and the reference voltage may be the lowest voltage among voltages of the plurality of cathode terminals, i.e., the first power source voltage input to the first power source voltage terminal PVT_1 is the highest voltage among the voltages input to the first power source voltage terminal PVT_1, the plurality of cell voltage input terminals S1 to S6, and the first reference voltage terminal RVT_1; and, the first reference voltage input to the first reference voltage terminal RVT_1 is the lowest among the voltages input to the first power source voltage terminal PVT_1, the plurality of cell voltage input terminals S1 to S6, and the first reference voltage terminal RVT_1.

The second ASIC 30 includes a second constant voltage terminal PT_2 to which a second constant voltage VOUT_2 is input, a second power source voltage terminal PVT_2 to which a second power source voltage is input, a second reference voltage terminal RVT_2 to which a second reference voltage is input, and a plurality of cell voltage input terminals S11 to S15 connected to nodes of the plurality of unit cells C8 to C14 through the plurality of resistors R10 to R14. The second constant voltage VOUT_2 is a voltage input from the second constant voltage generator 60, the second power source voltage is a voltage supplied from the cathode terminal of the unit cell C8 through the resistor R9, i.e., supplied from the anode of the unit cell C9, and the second reference voltage is a voltage from a cathode of the unit cell C14 that is input through the resistor R15, i.e., supplied from the anode of the unit cell C15. Here, the second power source voltage terminal PVT_2 is connected to the first reference voltage terminal RVT_1 of the first ASIC 20, and the second reference voltage terminal RVT_2 is connected to the third power source voltage terminal PVT_3 of the third ASIC 40. The second ASIC 30 measures a voltage difference between the second power source voltage terminal PVT_2 and the cell voltage input terminal S11 so as to measure a voltage of the unit cell C9.

The third ASIC 40 includes a third constant voltage terminal PT_3 to which a third constant voltage VOUT_3 is input, a third power source voltage terminal PVT_3 to which a third power source voltage is input, a third reference voltage terminal RVT_3 to which a third reference voltage is input, and the plurality of cell voltage input terminals S21 to S25 connected to nodes of the plurality of unit cells C17 to C21 through the plurality of resistors R17 to R21. The third constant voltage VOUT_3 is a voltage input from the third constant voltage generator 70, the third power source voltage is a voltage supplied from the anode terminal of the unit cell C16 through the resistor R16, and the third reference voltage is a voltage from a cathode of the unit cell C21 that is input through the resistor R22. The third ASIC 40 measures a voltage difference between the third power source voltage terminal PVT_3 and the cell voltage input terminal S21 so as to measure a voltage of the unit cell C16.

Here, the first ASIC 20 is supplied with a voltage obtained by subtracting the first reference voltage from the first constant voltage VOUT_1. In further detail, the first reference voltage supplied to the first ASIC 20 is a cathode voltage of the unit cell C7 input to the first reference voltage terminal RVT_1, and the first power source voltage is an anode voltage of the unit cell C1. The first constant voltage VOUT_1 is a voltage that is higher than the first power source voltage by a floating voltage of a predetermined level. For example, if it is assumed that the anode voltage of the unit cell C1 is 5V, the cathode voltage of the unit cell C7 is 3.6V, and the floating voltage supplies the first constant voltage VOUT_1 that is higher than the first power source voltage by 3.5V, then the first constant voltage VOUT_1 is 8.5V and the first reference voltage is 3.6V, and therefore 4.9V is supplied to the first ASIC 20. The second ASIC 30 and the third ASIC 40 are similar to the first ASIC 20. That is, the second ASIC 30 is supplied with a voltage that corresponds to a voltage difference between the second constant voltage VOUT_2 from the second constant voltage generator 60 and the second reference voltage, and the third ASIC 40 is supplied with a voltage that corresponds to a voltage difference between the third constant voltage VOUT_3 from the third constant voltage generator 70 and the third reference voltage.

The first constant voltage generator 50 receives a voltage VI from the voltage supply unit 80 and applies the first constant voltage VOUT_1 to the first ASIC 20. Here, an input voltage VI terminal of the first constant voltage generator 50 is connected to an output of the voltage supply unit 80, and a first output voltage VOUT_1 terminal is connected to the first constant voltage terminal PT_1. In addition, a first reference voltage VGND_1 terminal of the first constant voltage generator 50 is connected to the first power source voltage terminal PVT_1.

The second constant voltage generator 60 receives the voltage VI from the voltage supply unit 80 and applies a second constant voltage VOUT_2 to the second ASIC 30. Here, an input voltage VI terminal of the second constant voltage generator 60 is connected to the output of the voltage supply unit 80, and a second output voltage VOUT_2 terminal is connected to the second constant voltage terminal PT_2. In addition, a second reference voltage VGND_2 terminal of the second constant voltage generator 60 is connected to the second power source voltage terminal PVT_2. Moreover, the second reference voltage VGND_2 terminal of the second constant voltage generator 60 is also connected to the first reference voltage terminal RVT1 of the first ASIC 20.

The third constant voltage generator 70 receives the voltage VI from the voltage supply unit 80 and applies a third constant voltage VOUT_3 to the third ASIC 40. Here, an input voltage VI terminal of the third constant voltage generator 70 is connected to the output of the voltage supply unit 80, and a third output voltage VOUT_3 terminal is connected to the third constant voltage terminal PT_3. In addition, a third reference voltage VGND_3 of the third constant voltage generator 70 is connected to the third power source voltage terminal PVT_3. Moreover, the third reference voltage VGND_3 of the third constant voltage generator 70 is also connected to the second reference voltage terminal RVT_2 of the second ASIC 30. Configurations of the first to third constant voltage generators 50, 60, and 70 will be described in further detail later with reference to FIG. 2.

The voltage supply unit 80 supplies voltages for the first to third constant voltage generators 50, 60, and 70 to generate the first to third constant voltages VOUT_1 to VOUT_3, respectively. In further detail, the voltage supplied by the voltage supply unit 80 may be sufficiently higher than the maximum voltage of the fuel cell stack 10 by a predetermined-level floating voltage. In this exemplary embodiment of the present invention, the output voltage of the voltage supply unit 80 is set to 40V. However, aspects of the present invention are not limited thereto.

Figure 2:
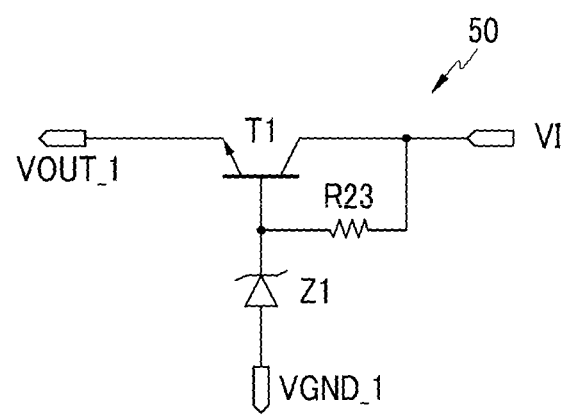
FIG. 2 shows a first constant voltage generator 40 of FIG. 1.

FIG. 2 shows the first constant voltage generator 50 of FIG. 1. The second and third constant voltage generators 60 and 70 are the same as the first constant voltage generator 50 in configuration and operation. The first to third constant voltage generators 50, 60, and 70 according to the exemplary embodiment of the present invention can use a regulated power source ASIC, and a simple circuit thereof will be described with reference to FIG. 2.

Referring to FIG. 2, the first constant voltage generator 50 includes a transistor T1, a resistor R23, and a Zener diode Z1. The transistor T1 is an NPN-type bipolar junction transistor, and a base terminal thereof is connected to a cathode terminal of the Zener diode Z1. In addition, a collector terminal of the transistor T1 is connected to an input voltage VI terminal, and an emitter terminal is connected to the first output voltage VOUT_1 terminal. The resistor R23 is connected between the input terminal VI and the cathode terminal of the Zener diode Z1. An anode terminal of the Zener diode Z1 is connected to the first reference voltage VGND_1 terminal.

The first constant voltage generator 50 divides a voltage VI received from the voltage supply unit 80 by using the resistor R23 and the Zener diode Z1, and supplies a clamping voltage of the Zener diode Z1 to the base terminal of the transistor T1. The Zener diode Z1 is turned on when a voltage difference between the cathode electrode and the anode electrode of the Zener diode Z1 is greater than a breakdown voltage, and in this case, the voltage difference is maintained at the breakdown voltage. In this exemplary embodiment of the present invention, the Zener diode Z1 is turned on so as to maintain a constant voltage of the cathode electrode of the Zener diode Z1, and the voltage maintained at the cathode electrode is referred to as a clamping voltage. The transistor T1 is turned on by the clamping voltage, and a predetermined constant voltage is output therethrough. The predetermined constant voltage is a voltage obtained by subtracting a threshold voltage of the transistor T1 from the clamping voltage. Therefore, the floating voltage of the first constant voltage generator 50 according to this exemplary embodiment of the present invention is a voltage that is obtained by subtracting the threshold voltage of the transistor T1 from the breakdown voltage of the Zener diode Z1. However, in the above-described configuration, a current path may be formed from the voltage VI terminal to the first reference voltage VGND_1 terminal. In such case, current is as weak as 1 mA to 10 mA, but a voltage measurement error may occur when a current flowing to the fuel cell stack 10 is less than 1 A. Therefore, inflow of current generated from the first constant voltage generator 50 to the fuel cell stack 10 can be prevented by providing a current blocking element according to aspects of the present invention.

Figure 3:
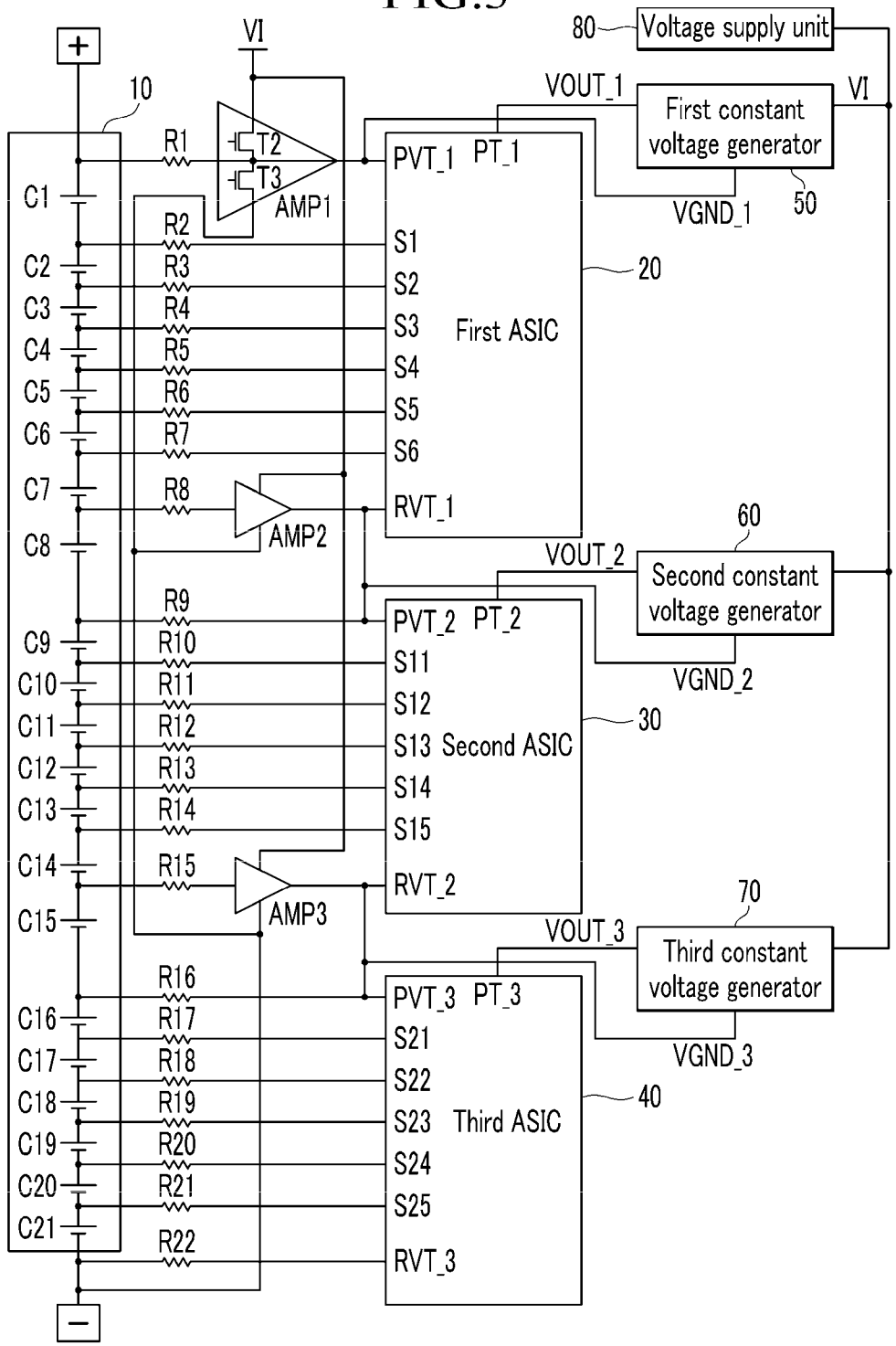
FIG. 3 shows a fuel cell system according to another exemplary embodiment of the present invention.

FIG. 3 shows a fuel cell system according to an exemplary embodiment of the present invention. Like elements of the configuration of FIG. 1 are assigned like reference numerals. Referring to FIG. 3, the fuel cell system according to this exemplary embodiment of the present invention includes a fuel cell stack 10, a plurality of protection resistors R1 to R22, first to third ASICs 20, 30, and 40, first to third constant voltage generators 50, 60, and 70, a voltage supply unit 80, and first to third current blocking elements AMP1 to AMP3. Configuration and operation of the fuel cell stack 10, the first to third ASICs 20, 30, and 40, the first to third constant voltage generators 50, 60, and 70, and the voltage supply unit 80 are the same as those described with reference to FIG. 1, and thus they will not be further described.

This exemplary embodiment is different from the previous exemplary embodiment in that the fuel cell system further includes first to third current blocking elements AMP1 to AMP3. An input terminal of the first current blocking element AMP1 is connected to the resistor R1, and an output terminal of the first current blocking element AMP1 is connected to the first reference voltage VGND_1 terminal of the first constant voltage generator 50. An input terminal of the second current blocking element AMP2 is connected to the resistor R8, and an output terminal of the second current blocking element AMP2 is connected to the second reference voltage VGND_2 terminal of the second constant voltage generator 60. Further, the output terminal of the second current blocking element AMP2 is connected to the second power source voltage terminal PVT_2. An input terminal of the third current blocking element AMP3 is connected to the resistor R15, and an output terminal of the third current blocking element AMP3 is connected to the third reference voltage VGND_3 terminal of the third constant voltage generator 70. Further, the output terminal of the third current blocking element AMP3 is connected to the third power source voltage terminal PVT_3. In addition, the first to third current blocking elements AMP1 to AMP3 are driven by a voltage VI output from the voltage supply unit 80.

Here, the first to third current blocking elements AMP1 to AMP3 may be formed of an operation amplifier. The operation amplifier generally includes transistors T2 and T3 that are connected in series between the voltage VI terminal and the second power source voltage terminal (−) at an output terminal thereof. The transistors T2 and T3 may be NMOS transistors, and may be weakly turned on when a drain terminal potential is higher than a source terminal potential. Since a potential of the first reference voltage VGND_1 terminal is higher than a potential of the second power source voltage terminal (−), i.e., the ground voltage (GND), the transistor T3 is weakly turned on. Then, a current path is formed from the first reference voltage VGND_1 terminal to the second power source voltage terminal (−) through the transistor T3 so that inflow of the current flowing to the first reference voltage VGND_1 terminal to the fuel cell stack 10 can be prevented. Here, an output terminal and an inversed input terminal (−) of the operation amplifier are connected to each other, and the input terminals of the first to third current blocking elements AMP1 to AMP3 correspond to the non-inversed input terminal (+) of the operation amplifier.

As described above, the fuel cell system according to aspects of the present invention additionally receives power source voltages of the first to third ASICs 20, 30, and 40 from the first to third constant voltage generators 50, 60, and 70. Therefore, when the voltages of the unit cells C1 to C7 are low, the first ASIC 20 can be normally operated. The second and third ASICs 30 and 40 can be normally operated since they can similarly receive a sufficient voltage from the second and third constant voltage generators 60 and 70.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A fuel cell system, comprising:
   a fuel cell stack comprising a plurality of unit cells;
   a circuit configured to receive a power level voltage from one of the unit cells and to receive a reference voltage from another of the unit cells, to measure a voltage value of each unit cell, and to discharge a unit cell if the measured voltage value of the unit cell is greater than a reference value;
   a voltage supply unit, configured to provide power to a voltage generator, wherein the voltage of the voltage supply unit is greater than the highest voltage of the fuel cell stack; and
   the voltage generator is configured to generate a first voltage to provide power to the circuit, wherein the first voltage is generated by combining a floating voltage of a predetermined level with the received power level voltage.

2. The fuel cell system of claim 1, wherein the circuit comprises:
   a power source voltage terminal to which the power level voltage is input;
   a constant voltage terminal to which the first voltage is input;
   a first reference voltage terminal to which the reference voltage is input; and
   a plurality of cell voltage input terminals respectively connected to a plurality of anode terminals and a plurality of cathode terminals of the unit cells.

3. The fuel cell system of claim 2, wherein the power level voltage is the highest voltage of the voltages of the unit cells, and the reference voltage is the lowest voltage of the voltages of the unit cells.

4. The fuel cell system of claim 2, wherein the voltage generator comprises:
   an input terminal to which power from the voltage supply unit is supplied;
   an output terminal connected to the constant voltage terminal; and
   a power level voltage terminal connected to the power source voltage terminal of the circuit.

5. The fuel cell system of claim 4, wherein the voltage generator comprises:
   a transistor having a collector terminal connected to the input terminal and an emitter terminal connected to the output terminal;
   a Zener diode having a cathode terminal connected to a base terminal of the transistor and an anode terminal connected to the power level voltage terminal; and
   a resistor connected between the collector terminal of the transistor and the cathode terminal of the Zener diode.

6. The fuel cell system of claim 5, wherein the first voltage is greater than the power level voltage by a voltage obtained by subtracting a threshold voltage of the transistor from a breakdown voltage of the Zener diode.

7. The fuel cell system of claim 2, further comprising:
   a plurality of resistors, each connected between the anode terminal and the cathode terminal of each of the plurality of unit cells and one of the power source voltage terminal, the first reference voltage terminal, and the plurality of cell voltage input terminals.

8. The fuel cell system of claim 7, further comprising a current blocking element between one of the resistors and the power source voltage terminal.

9. The fuel cell system of claim 8, wherein the current blocking element comprises:
   an amplifier having an input terminal connected to the resistor; and
   an output terminal connected to the power source voltage terminal.

10. The fuel cell system of claim 9, wherein the voltage supply unit is configured to supply a voltage to the current blocking element, wherein the amplifier comprises:
    at least two transistors connected in series between an input voltage terminal connected to the voltage supply unit and a second voltage input terminal.

* * * * *